SR

OR 3,543,058

Nov. 24, 1970 P. G. KLEMENS 3,543,058

PIEZOELECTRIC TRANSDUCER

Original Filed Oct. 29, 1965

WITNESSES

Edwin E. Bassler

James F. Young

INVENTOR

Paul G. Klemens

BY Gordon H. Telfer

ATTORNEY

United States Patent Office 3,543,058

Patented Nov. 24, 1970

3,543,058

PIEZOELECTRIC TRANSDUCER

Paul G. Klemens, Wilkinsburg, Pa., assignor to Westinghouse Electric Corporation, Pittsburgh, Pa.

Continuation of application Ser. No. 505,715, Oct. 29 1965. This application Nov. 10, 1969, Ser. No. 871,534

Int. Cl. H01v 17/00

U.S. Cl. 310—8.2 11 Claims

ABSTRACT OF THE DISCLOSURE

A transducer for electrical-acoustic energy conversion is provided having a plurality of layers of material in an acoustically continuous structure, each layer having an effective thickness of ½ the desired wavelength, with a first set of alternate ones of the layers being of like oriented piezoelectric material. The other alternate layers may be passive or also of piezoelectric material but having opposite orientation to that of the first set.

This application is a continuation of application Ser. No. 505,715, filed Oct. 29, 1965.

This invention relates generally to apparatus for converting electrical energy to mechanical energy and, more particularly, to piezoelectric transducers for generating high-frequency elastic waves.

It is of interest to achieve efficient conversion of an electromagnetic wave into an elastic or acoustic wave, or the reverse, in order, for example, to take advantage of the lower velocity of the acoustic wave in a delay line and in general to enable the performance of the known functions of piezoelectric transducers. Below microwave frequencies, say about $10^8$ c.p.s., the prior art has achieved generally satisfactory transducers employing a structure that is essentially homogeneous. The body of active piezoelectric material may be of the order of 1 micron in size for such relatively low frequency generation. Bodies of piezoelectric material of that size are readily obtainable.

At higher frequencies severe problems have been encountered because the dimensions of the piezoelectric material must be quite small and the nature of the process of piezoelectric generation of elastic waves is such that a structure may not be scaled up an integral number of wavelengths with effectiveness.

The latter difficulty results because generation of acoustic waves in piezoelectric materials is essentially a surface phenomenon. This may be explained as follows. For conversion between the two forms of energy in the volume of a piezoelectric crystal two conditions must exist. The frequencies of the two waves must be equal and the wave vectors of the two waves must also be equal. By the wave vector is meant a vector in the direction of propagation, of magnitude $2\pi/\lambda$, where $\lambda$ is the wavelength. The latter condition insures satisfaction of the general requirement for wave interaction in a uniform medium, expressed mathematically, that the interaction hamiltonian, when integrated over a large volume, does not vanish. Because of the great difference between the velocities of electromagnetic (about $3\times10^{10}$ cm./sec.) and elastic (about $5\times10^5$ cm./sec.) waves these two conditions cannot be satisfied simultaneously in the body of a crystal. Thus, only a small volume of a crystal near the surface is involved in the piezoelectric generation of acoustic waves and its depth is limited to the order of the wavelength of the wave. This reduces the effectiveness of the generation process particularly at high frequencies because it is also the case that the intensity of generation for a given electric field strength is essentially proportional to the square of the effective volume.

Alternatively, it can be said, within the limits of lowest order perturbation theory, the conversion between electromagnetic and acoustic energy is proportional to $$|\int P(x)e^{iq.x}dx|^2$$

wherein $P(x)$ is the piezoelectric coefficient as a function of position, $x$, and $q$ is the wave vector of the phonon (the wave vector of the photon being negligible).

It is therefore an object of the present invention to provide an improved piezoelectric transducer, particularly for microwave frequencies.

Another object is to provide an improved piezoelectric transducer for efficient conversion between electromagnetic and acoustic energy, particularly at high frequencies, that is not effectively limited to an active volume only near the surface of the transducer.

The invention, briefly, achieves the above-mentioned and additional objects and advantages in a transducer that comprises a plurality of layers of material in an acoustically continuous structure, each layer having an effective thickness of ½ of the desired wavelength with a first set of alternate ones of the layers being of a piezoelectric material having substantially uniform crystallographic orientation perpendicular to the plane of the layers. Each of the referred to layers of piezoelectric material acts as a generator that enhances the overall conversion.

The layers of material intermediate those of the referred to alternate layers of piezoelectric material may be of two general types. They may be nonpiezoelectric so that they merely act as part of an acoustic transmission line without affecting the generation process or, preferably, they are also a piezoelectric material but the crystal structure is of reverse orientation so that the phase of acoustic wave generation is opposite to that in the first referred to set of layers so that additional enhancement of the conversion process is achieved.

The invention, together with the above-mentioned and additional objects and advantages thereof, will be better understood by referring to the following description taken with the accompanying drawing, wherein.

The present invention utilizes the principle that periodic modulation of the piezoelectric parameters in a structure having crystalline continuity will improve the efficiency of the conversion process. In effect, the invention achieves a bulk phenomenon by the periodic modulation of the piezoelectric coupling constant at the same period as the wavelength of the elastic wave to be generated. The wave vector condition requires that the modulation is essentially one dimensional, that is, the properties of the material used must be uniform in a plane normal to the direction of wave propagation. With such modulation, the elastic wave will be generated throughout the volume of the crystal with the strength proportional to the square of the modulation and the volume effect thereby achieved can be made to exceed the surface generation of waves. In mathematical terms, periodic modulation increases the $q$'th Fourier coefficient of $P(x)$ in the expression above referred to.

Figure 1:
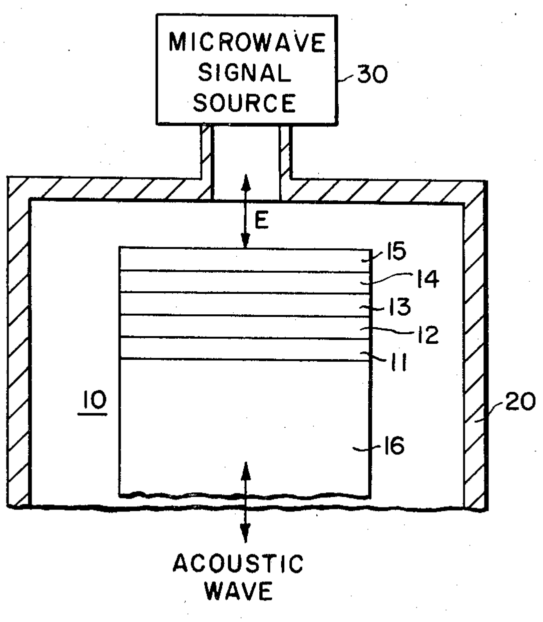
FIG. 1 is a sectional view illustrating one embodiment of the present invention.

FIG. 1 illustrates the essential elements of an embodiment of this invention for the generation of high frequency elastic waves. The number 10 represents the active element of the transducer and comprises a plurality of layers 11, 12, 13, 14 and 15 disposed on a substrate 16 in an acoustically continuous structure, that is, there is at least sufficient crystalline continuity between the layers and substrate in a direction perpendicular to the plane of the layers, as by the uniform orientation of the $c$ axis of the materials of the layers in that direction, to permit propagation of an elastic wave.

The substrate 16 serves merely as a support and as part of an acoustic transmission line. It would not be necessary to use a substrate except that for high frequency wave generation the layers 11 through 15 are too small to be handled and self-supported in a practical manner.

The plurality of layers 11 through 15 includes a first set of alternate layers 11, 13 and 15 that are of a piezoelectric material. The remaining layers 12 and 14 are either of a nonpiezoelectric material or are of a piezoelectric material in which the direction of the crystallographic axis and therefore the pase of the generated wave is 180° from that in the first set of layers.

All of the plurality of layers 11 through 15 have an effective thickness of ½ of the desired elastic wavelengths. By effective thickness is meant that the layer thickness may not only be ½ of the wavelength but may also be an odd integral multiple thereof. However, the scaling up of the layer thicknesses will result in a reduction of conversion efficiency that is undesirable. Hence it is contemplated that at least no more than a small multiple of ½ wavelengths be used.

In the illustrated structure there are three layers 11, 13 and 15 in the referred to set of piezoelectric layers with two intermediate layers 12 and 14 of passive material or oppositely oriented piezoelectric material. However, it is to be understood that additional layers may be employed in keeping with this invention and also that a structure having only two active layers 11 and 13 may be employed consistent wth the principles of this invention.

The active transducer structure 10 is disposed within a resonant cavity 20 that is coupled to microwave signal source 30. An electromagnetic wave at microwave frequency is established within the cavity. In this example it is assumed the field E is in a direction perpendicular to the plane of the plurality of layers 11 through 15 for the generation of a compressional acoustic wave. Where the frequency of the electric field E corresponds with the thickness of the layers there will be acoustic wave propagation through those layers and the substrate 16 at that same frequency. It is also possible to generate shear acoustic waves using an electric field of suitable orientation.

Figure 2:
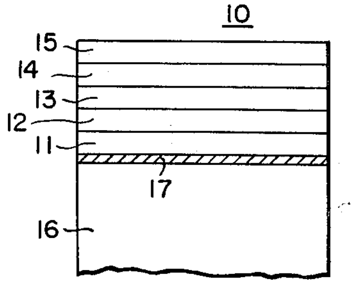
FIGS. 2, 3 and 4 illustrate alternate embodiments of the invention.

FIG. 2 illustrates a similar structure for the active portion 10 of the transducer as in FIG. 1 with, however, an additional metal layer 17 positioned between the plurality of layers 11 and 15 and the substrate 16 for the purpose of assisting in concentrating the electric field within the plurality of layers.

Figure 3:
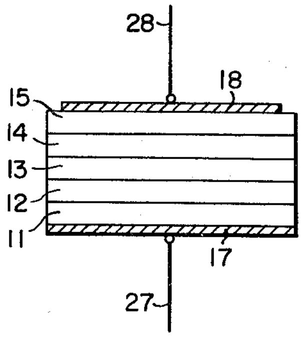

FIG. 3 shows a structure including the plurality of layers 11 through 15 but not including a substrate 16 and with electrical metal contacts 17 and 18 on the opposite faces of the plurality of layers with leads 27 and 28 thereto for the application of an electric field. This configuration will be suitable for frequencies at which resonance may be achieved without using a cavity.

Figure 4:
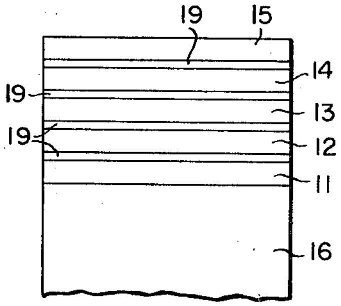

FIG. 4 illustrates another structure wherein the plurality of layers 11 through 15 are spaced apart by inter-layers 19 that serve the purpose of bonding together the layers 11 through 15. Such layers of materials such as Canada Balsam would be required if individual slices of materials for layers 11 through 15 were the starting point of the structure. Such interlayers of some passive material would also be useful where it is desired to space adjacent ones of the layers 11 through 15 in order to assist in achieving opposite orientation of piezoelectric layers in accordance with the embodiments of the invention where the intermediate layers 12 and 14 are of piezoelectric material oppositely oriented to that of layers 11, 13 and 15.

A variety of known materials and techniques may be employed in practicing the present invention. Where it is desired to generate compressional waves it is necessary that the active materials be such that their *c* axes may be oriented along the direction of propagation. For the generation of shear waves it is necessary that both the *a* and *c* axes of the materials be substantially uniformly oriented.

For the active layers 11, 13 and 15 suitable examples of materials include, but are not limited to, cadmium sulfide, zinc sulfide and gallium arsenide while the passive layers 12 and 14 may be of materials such as silicon dioxide, aluminum oxide, titanium dioxide, magnesium oxide or the like that are not to be piezoelectric and may be deposited by techniques whereby they assume sufficient crystal orientation to assure acoustic continuity through the structure.

The above mentioned materials are generally capable of fabrication in films of adequate thickness by direct evaporation of the compound employing a substrate of a crystalline material such as aluminum oxide, titanium dioxide, or magnesium oxide.

However, a preferred technique is that disclosed in copending application Ser. No. 820,702, filed Oct. 29, 1965, by J. de Klerk and assigned to the assignee of the present invention, whereby films of materials having good piezoelectric properties are formed by evaporating the elements of the compound from separate sources with a controlled substrate temperature that results in stoichiometric compound formation on a substrate. Reference should be made to the copending application for further description of this technique.

By way of further example, structures have been made as illustrated in FIG. 1 and the expected gain in conversion efficiency has been realized. The structure was made for a generation of waves at one gigacycle per second. The substrate 16 was a single crystal rod of aluminum oxide on the end of which a layer of cadmium sulfide formed in accordance with the technique of the copending application was deposited and then a layer of an oxide of silicon formed by evaporation from a silicon monoxide source, then another layer of cadmium sulfide, another layer of silicon oxide and a final layer of cadmium sulfide. For one gigacycle per second it is necessary that the cadmium sulfide layers be 2.2 microns thick. The silicon oxide film is 2.1 microns thick. The required thickness of the layers need not be precisely determined beforehand. The frequency shift indicated by a quartz crystal oscillator on which the films are also formed will indicate when the correct thickness has been reached.

After the deposition of each layer the conversion efficiency of the transducer was measured at room temperature. A gain of 6 db was achieved by the use of two cadmium sulfide layers separated by a silicon monoxide layer compared with that achieved with a single cadmium sulfide layer. When three active cadmium sulfide layers separated by alternate passive silicon monoxide layers were employed a gain of 9.5 db enhancement over a single cadmium sulfide layer was achieved. Thus, it is found that the conversion efficiency is proportional to the square of the number of active layers although it is considered unlikely that this variation continues to hold for increasingly larger numbers of layers.

It is of interest to note that a transducer of x-cut quartz of the same dimensions as the aluminum oxide rod in the same cavity using identical transmitter power exhibited a conversion loss 19.5 db greater per transduction than that of the three active layer cadmium sulfide transducer, after correcting for acoustic losses in the quartz and aluminum oxide delay lines.

Use of a material that may be formed either as a piezoelectric insulator or as a nonpiezoelectric semiconductor is suitable and may offer fabrication advantages. For example, gallium arsenide, and other III–V compounds, can be grown by various known epitaxial growth techniques with or without the presence of dopants. It is therefore possible to grow active layers 11, 13 and 15 of insulating gallium arsenide and intermediate layers 12 and 14 of doped gallium arsenide with insurance of good crystalline continuity as well as the desired piezoelectric properties in layers 11, 13 and 15 and passive qualities in layers 12 and 14.

Additionally, the periodic modulation of the structure may be achieved by alternating layers of similar materials such as nonpiezoelectric germanium with piezoelectric gallium arsenide. Techniques have been disclosed for the growth of such materials on each other.

A further technique is one to utilize the disclosed embodiment of the invention wherein the intermediate layers 12 and 14 are of piezoelectric material of opposite crystallographic orientation to that of the first set of layers 11, 13 and 15. This may be achieved by the growth of zinc sulfide films by the techniques disclosed in the referred to copending application wherein a continuous intermediate layer of negligible acoustic effect such as one at least 20 atomic layers thick of silicon oxide or aluminum oxide as illustrated in FIG. 4 is employed. A suitably chosen intermediate layer is believed to cause the crystallographic orientation of a subsequently deposited zinc sulfide layer to be the reverse of that of the immediately preceding zinc sulfide layer.

While the present invention has been shown and described in a few forms only, it will be apparent that various modifications may be made without departing from the spirit and scope thereof.

I claim as my invention:

1. A piezoelectric transducer comprising: a plurality of layers of material joined in an acoustically continuous structure; said plurality of layers including a first set of at least two layers of piezoelectric material having the same direction of piezoelectric material having the same direction of piezoelectric orientation; said plurality of layers also including a second set of layers, of at least one layer, having different electromechanical properties from said first set of layers, one of said second set of layers being positioned between each pair of said first set of layers; each adjacent pair of layers, including one layer of said first set and one layer of said second set, being proportioned in thickness to produce periodic modulation of the piezoelectric coupling constant at the same period as the desired acoustic wavelength; each of said adjacent pairs of layers being free of external electrical connection therebetween.

2. The subject matter of claim 1 wherein: said first set of layers comprises piezoelectric material having substantially uniform crystallographic orientation perpendicular to the plane of the layers.

3. The subject matter of claim 1 wherein: said second set of layers comprises nonpiezoelectric material.

4. The subject matter of claim 3 wherein: said first and second sets of layers comprises the same crystalline material with doping impurities in said second set of layers to prevent piezoelectric activity therein.

5. The subject matter of claim 1 wherein: adjacent ones of said layers are directly joined to each other.

6. The subject matter of claim 1 wherein: an interlayer of nonpiezoelectric material that is very thin compared with the desired wavelength is positioned between each adjacent pair of layers of said first and second sets.

7. The subject matter of claim 1 wherein: said second set of layers is of a piezoelectric material in which the phase of generated acoustic waves is 180° from that in said first set of layers.

8. The subject matter of claim 7 wherein: said second set of layers is of the same crystalline material as said first set of layers, said second set of layers having an inverted orientation with respect to said first set of layers.

9. The subject matter of claim 1 wherein: each of said layers has an effective thickness of one-half of the desired acoustic wavelength.

10. A piezoelectric transducer, suitable for high frequency acoustic wave generation, comprising: a cavity resonator, a plurality of layers of material joined in an acoustically continuous structure disposed within said cavity resonator, each of said plurality of layers having an effective thickness of one-half of the desired acoustic wavelength and including a first set of alternate layers of piezoelectric material having substantially the same uniform crystallographic orientation perpendicular to the plane of said layers, an additional one of said plurality of layers disposed between said layers of said first set and comprising nonpiezoelectric material.

11. The subject matter of claim 10 wherein: said plurality of layers are disposed on a crystalline substrate.

References Cited

UNITED STATES PATENTS

| | | | |
|---|---|---|---|
| 2,984,756 | 5/1961 | Bradfield | 310—9.4 |
| 2,498,737 | 2/1950 | Holden | 259—1 |
| 3,271,622 | 9/1966 | Malagodi et al. | 315—246 |
| 2,787,777 | 4/1957 | Camp | 340—10 |
| 3,093,758 | 6/1963 | Hutson | 310—8 |
| 3,317,847 | 5/1967 | White | 329—198 |
| 2,540,194 | 2/1951 | Ellett | 310—8.5 |
| 3,012,211 | 12/1961 | Mason | 310—8 |
| 3,138,726 | 6/1964 | Samuelson | 310—8.1 |
| 3,453,456 | 7/1969 | Oltman et al. | 310—8.6 |

WARREN E. RAY, Primary Examiner

B. A. REYNOLDS, Assistant Examiner

U.S. Cl. X.R.

310—8.3, 8.6; 333—30